(12) United States Patent
Yu et al.

(10) Patent No.: US 12,314,817 B2
(45) Date of Patent: May 27, 2025

(54) METHOD FOR SIMULATING STOCHASTIC OSCILLATION IN INDIVIDUAL-GRANULARITY LONG-DISTANCE EXPRESSWAY TRAFFIC FLOW USING QUANTUM HARMONIC OSCILLATOR

(71) Applicant: NANJING NORMAL UNIVERSITY, Jiangsu (CN)

(72) Inventors: Zhaoyuan Yu, Jiangsu (CN); Xu Hu, Jiangsu (CN); Zhenjun Yan, Jiangsu (CN); Linwang Yuan, Jiangsu (CN); Jiyi Zhang, Jiangsu (CN)

(73) Assignee: NANJING NORMAL UNIVERSITY, Jiangsu (CN)

( * ) Notice: Subject to any disclaimer, the term of this patent is extended or adjusted under 35 U.S.C. 154(b) by 885 days.

(21) Appl. No.: 17/606,050

(22) PCT Filed: Nov. 20, 2020

(86) PCT No.: PCT/CN2020/130410
§ 371 (c)(1),
(2) Date: Oct. 25, 2021

(87) PCT Pub. No.: WO2022/104693
PCT Pub. Date: May 27, 2022

(65) Prior Publication Data
US 2022/0309377 A1     Sep. 29, 2022

(30) Foreign Application Priority Data

Nov. 17, 2020   (CN) .......................... 202011282775.4

(51) Int. Cl.
*G06N 10/20*    (2022.01)
*G06F 17/13*    (2006.01)
(Continued)

(52) U.S. Cl.
CPC ............. *G06N 10/60* (2022.01); *G06F 17/13* (2013.01); *G06N 10/20* (2022.01); *G06Q 50/40* (2024.01)

(58) Field of Classification Search
CPC ....................................................... G06N 10/20
(Continued)

(56) References Cited

U.S. PATENT DOCUMENTS 6,472,683 B1 *  10/2002  Li .......................... B82Y 20/00
                                                          257/25
9,037,519 B2    5/2015   Han et al.
(Continued)

FOREIGN PATENT DOCUMENTS

CN      105931474       9/2016
CN      111027662       4/2020
(Continued)

OTHER PUBLICATIONS

"International Search Report (Form PCT/ISA/210) of PCT/CN2020/130410," mailed on Jun. 28, 2021, pp. 1-5.
(Continued)

*Primary Examiner* — Reza Nabi
(74) *Attorney, Agent, or Firm* — JCIP GLOBAL INC.

(57) ABSTRACT

The present invention discloses a method for simulating stochastic oscillation in an individual-granularity long-distance expressway traffic volume using a quantum harmonic oscillator, which includes: firstly, describing the speed and position of a vehicle by a quantum superposition state, and constructing an energy eigenequation of the quantum harmonic oscillator to represent movement of the vehicle; secondly, constructing an n-order Hermite polynomial based on the energy eigenequation, constructing a quantum harmonic oscillator model for simulating the stochastic oscillation in the long-distance traffic flow in a mode featuring
(Continued)

aliasing of multiple strategies, and optimizing a solution model; and finally, constructing a mapping mechanism between the probability and the traffic volume to simulate the traffic volume. The present invention definite parameter meaning, and easy solution and calculation, and is of reference significance for modeling of traffic flow in which multiple strategies and states exist for individuals and are difficult to observe.

3 Claims, 6 Drawing Sheets

(51) Int. Cl.
*G06N 10/60* (2022.01)
*G06Q 50/40* (2024.01)
(58) Field of Classification Search
USPC .......................................................... 706/62
See application file for complete search history.

(56) References Cited

U.S. PATENT DOCUMENTS

| | | | |
|---|---|---|---|
| 10,965,710 B1* | 3/2021 | Carlson | H04L 63/0209 |
| 11,915,100 B2* | 2/2024 | Yamaji | H03B 15/003 |
| 12,021,520 B2* | 6/2024 | Yamamoto | H03K 19/195 |
| 2011/0250861 A1* | 10/2011 | Lyons | H03D 7/1466 |
| | | | 455/326 |
| 2018/0051293 A1* | 2/2018 | Ducat | C07K 14/195 |
| 2018/0358539 A1* | 12/2018 | Goto | H10N 60/12 |
| 2019/0139449 A1* | 5/2019 | Zhang | G09B 19/167 |
| 2021/0273731 A1* | 9/2021 | Zhang | H04B 10/70 |
| 2021/0365606 A1* | 11/2021 | Yu | G06F 30/20 |
| 2022/0300678 A1* | 9/2022 | Yu | G08G 1/0125 |
| 2022/0309377 A1* | 9/2022 | Yu | G06F 30/20 |
| 2022/0375339 A1* | 11/2022 | Luo | G06F 17/18 |
| 2023/0384119 A1* | 11/2023 | Zeng | H04W 4/40 |
| 2024/0265286 A1* | 8/2024 | Hacohen-Gourgy | |
| | | | G06N 10/40 |
| 2024/0305663 A1* | 9/2024 | Routt | H04L 63/1425 |

FOREIGN PATENT DOCUMENTS

| | | |
|---|---|---|
| CN | 111126611 | 5/2020 |
| CN | 111260118 | 6/2020 |
| CN | 111932869 | 11/2020 |

OTHER PUBLICATIONS

"Written Opinion of the International Searching Authority (Form PCT/ISA/237) of PCT/CN2020/130410," mailed on Jun. 28, 2021, pp. 1-4.

* cited by examiner

Describing the speed and position of a vehicle by a quantum superposition state, and constructing an energy eigenequation of the quantum harmonic oscillator to represent movement of the vehicle

↓

Constructing an $n$-order Hermite polynomial based on the energy eigenequation, constructing a quantum harmonic oscillator model for simulating the stochastic oscillation in the long-distance traffic flow with multiple driving strategies, and optimizing a solution model

↓

Constructing a mapping mechanism between the probability and the traffic volume to simulate the traffic volume

FIG. 1

METHOD FOR SIMULATING STOCHASTIC OSCILLATION IN INDIVIDUAL-GRANULARITY LONG-DISTANCE EXPRESSWAY TRAFFIC FLOW USING QUANTUM HARMONIC OSCILLATOR

CROSS-REFERENCE TO RELATED APPLICATION

This application is a 371 of international application of PCT application serial no. PCT/CN2020/130410, filed on Nov. 20, 2020, which claims the priority benefit of China application no. 202011282775.4, filed on Nov. 17, 2020. The entirety of each of the above mentioned patent applications is hereby incorporated by reference herein and made a part of this specification.

TECHNICAL FIELD

The present invention relates to the fields of urban planning and traffic geography, and particularly relates to a method for simulating stochastic oscillations in an individual-granularity long-distance expressway traffic flow using quantum harmonic oscillator.

BACKGROUND

A long-distance expressway traffic flow features long duration, fast and nonuniform speed, high traffic density, complex interaction between individuals and the like. In the long-distance expressway traffic flow, different individuals may select strategies such as constant-speed driving, vehicle-following driving or abnormal driving dominated by overtaking. The aliasing of different driving strategies causes the long-distance expressway traffic flow to exhibit different oscillation characteristics and structures. With the refinement degree of observed data of the long-distance expressway traffic flow increasing to the individual granularity, the complex interaction processes such as self-organization, chaos, percolation and coherence begin to emerge, causing the long-distance expressway traffic flow to exhibit strong complexity and uncertainty. Meanwhile, stochastic oscillations in the long-distance traffic flow will lead to decrease in traffic capacity. Accurate modeling of stochastic oscillations in the long-distance expressway traffic flow has become an important prerequisite for traffic management, prediction and regulation.

Dynamic adjustment of driving strategies by a driver is an important reason of stochastic oscillations generated in the long-distance expressway traffic flow. Macroscopic statistical and intelligent learning models, which regard the traffic flow as a whole or abstract vehicles involved in the traffic flow as homogeneous units from a determinacy view, often have difficulty in describing stochastic oscillations in the traffic flow due to changes in the driving strategies. Microscopic simulation model, which regards individual vehicles in the traffic flow as single individuals, realizes simulation of the traffic flow at different scales through the interaction between the individuals, and somewhat reveals the nonlinear characteristic of the traffic flow. Although rule- and state-based vehicle-following models take individual heterogeneity into account, there is a limitation that the evolution equations or the iterative rules lack generality. The oscillator model is one of ideal models for describing stochastic oscillations in the long-distance traffic flow, but classical oscillator models require precise state information such as the speed and position of a vehicle, and solve a second-order differential equation for describing the classical spring oscillator through a large number of boundary condition constraints.

Recent studies have shown that a stochastic oscillation in the long-distance traffic flow is more an oscillator process than a hydrodynamic process, and classical spring oscillator models such as a spring oscillator car-following model, a mass-oscillator model and a spring-mass-damping oscillator model are developed accordingly. However, these classical spring oscillator models require precise state information such as the speed and position of a vehicle, and solve a second order differential equation for describing the spring oscillator through a large number of boundary condition constraints. In the real long-distance expressway traffic flow, only the total traffic volume at an entrance/exit can be obtained, and the autonomous decision of a driver and the vehicle interaction process in the traffic flow cannot be continuously tracked, so that the existing spring oscillator model can only approximately fit the average state of the whole traffic flow through empirical parameters, and is difficult to be directly applied to the precise simulation of the long-distance expressway traffic flow and the revealing of the stochastic oscillation structure in it. Therefore, based on classical spring oscillator models, the present patent application, from an uncertainty view, utilizes quantum states to describe a dynamic evolution process of vehicle state information under unobservable conditions, and realizes the optimal approximation of an unobservable intermediate process through the total traffic flow at an entrance/exit, so as to reveal the characteristics and mechanism of a stochastic oscillation in the long-distance traffic flow and the interaction relation between the stochastic oscillation and the traffic flow.

SUMMARY

Objective: The present invention provides a method for simulating stochastic oscillation in an individual-granularity long-distance expressway traffic flow using a quantum harmonic oscillator, which is of reference significance for modeling a traffic flow in which multiple strategies and states exist for individuals and are difficult to observe.

Technical scheme: The present invention provides a method for simulating stochastic oscillation in an individual-granularity long-distance expressway traffic flow using a quantum harmonic oscillator, which comprises the following steps:

(1) describing the speed and position of a vehicle by a quantum superposition state, and constructing an energy eigenequation of the quantum harmonic oscillator to represent movement of the vehicle;

(2) constructing an n-order Hermite polynomial based on the energy eigenequation, constructing a quantum harmonic oscillator model for simulating the stochastic oscillation in the long-distance traffic flow with multiple driving strategies, and optimizing a solution model; and (3) constructing a mapping mechanism between the probability and the traffic volume to simulate the traffic volume.

Further, the step (1) is implemented as follows:
all vehicles run at a constant speed of v, and an ideal position of any vehicle k at a time point t is $S_{k,t}$; when real speed of the vehicle is greater than or less than the ideal speed v, and recorded as $|\uparrow\rangle$ and $|\downarrow\rangle$, a real position of the vehicle is ahead of or behind the ideal position $S_{kt}$, and recorded as $|\rightarrow\rangle$ and $|\leftarrow\rangle$; the speed of the vehicle can be represented by the superposition state $V_t=a_t|\uparrow\rangle+b_t|\downarrow\rangle$ and the position can be represented by the superposition state $S_t=C_t|\rightarrow\rangle+d_t|\leftarrow\rangle$ at the time point t, wherein i is an imaginary unit, $a_t$ and $b_t$ represent the probability amplitudes of acceleration and deceleration, respectively, c and d represent the probability amplitudes of the position of the vehicle being ahead of or behind the ideal position, respectively, and $|a_t|^2+|b_t|^2=|c_t|^2+|d_t|^2=1$; the movement of the vehicle is described as a quantum harmonic oscillator with an energy eigenequation as follows:

$$iA\frac{d}{dt}\psi(x) = H\psi(x) \quad (1)$$

wherein i is an imaginary unit; A is a constant describing the distribution of individual energy levels; $\psi(x)$ is a wave function representing the probability amplitude of an individual appearing at a specific position; $H=f(V_t)+g(S_t)$ is Hamiltonian of the system and a core characteristic of dynamic evolution of the system; $f(V_t)$ and $g(S_t)$ are kinetic energy and potential energy of the harmonic oscillator, respectively.

Further, the step (2) is implemented as follows:

in a real expressway traffic flow, a following n-order Hermite polynomial is constructed based on the energy eigenequation:

$$\psi_n(x) = \sum_0^n \frac{w_n}{(\sqrt{\pi}2^n n!)^{\frac{1}{2}}} H_n(x) e^{\frac{-x^2}{2}} \quad (3)$$

wherein n is the number of energy levels representing the number of different driving strategies which can be selected by a driver in the driving process, $H_n(x)$ is an n-order Hermite polynomial, $w_n$ is a fitting parameter of the wave function representing the probability amplitude of the harmonic oscillator at different energy levels; in quantum mechanics, the probability can be expressed as the square of the wave function, so that the probability of the vehicle appearing at a specific position in the long-distance traffic flow can be expressed as:

$$P = |\psi_n(x)|^2 \quad (4)$$
$$= \left(\sum_0^n \frac{w_n}{(\sqrt{\pi}2^n n!)^{\frac{1}{2}}} H_n(x) e^{\frac{-x^2}{2}}\right)^2$$

equation (4) is a quantum harmonic oscillator model of the long-distance traffic flow;

$$h_n(x) = H_n(x)\frac{e^{\frac{-x^2}{2}}}{(\sqrt{\pi}2^n n!)^{\frac{1}{2}}}$$

is converted to a probability expression of the Hermite polynomial, wherein $h_n(x)$ reflects the oscillation structures of different modes; a probability density function of the traffic volume time series is fitted using Hermite polynomials with different orders according to equation (4), so that distribution characteristics of different distribution structures in the traffic volume time series are obtained through decomposition;

f(x) is set as the probability density function of the vehicle distribution, then the n-order Hermite polynomial approximation conversion is an optimization problem as follows:

$$\begin{cases} \text{Objective function}: \hat{f}(x) = \left(\sum_0^n w_n h_n(x)\right)^2 \\ \text{Constraint}: \sum_0^n w_n^2 = 1 \end{cases} \quad (5)$$

equation (5) is solved by a constrained nonlinear optimization, and points on an N-dimensional sphere $S^N$ are projected onto a plane $R^{N+1}$ by inverse stereographic projection, so that an unconstrained optimization solution is performed on the plane, with a specific algebraic expression of $$[P(\omega)]_n = \frac{\omega_n}{(1-\omega_0)}$$

expressed as follows:

$$\begin{cases} [P^{-1}(\gamma)]_n = \begin{cases} \frac{S^2-1}{S^2+1}, & \text{if } n=0 \\ \frac{2\gamma_n}{S^2+1}, & \text{if } n\geq 1 \end{cases} \\ S^2 = \sum_0^n \gamma_n^2 \end{cases} \quad (6)$$

maximum likelihood estimation is constructed as follows:

$$\begin{cases} \text{Objective function}: \hat{f}(x) = \left(\sum_{k=0}^n w_k h_k(x)\right)^2 \\ \text{likelihood function}: \ell(w) = \sum_{k=1}^K \log\left(\sum_{k=0}^n [P(w)]_k h_k(x_i)\right)^2 \end{cases} \quad (7)$$

Further, the step (3) is implemented as follows:

$$N_t=\int_0^t(\alpha_t P_t+\beta_t)=\alpha f(x)+\beta \quad (8)$$

wherein $N_t$ is the traffic volume of vehicles driving off from the expressway, $\alpha$ and $\beta$ are normalized coefficients, $\alpha_t$ is the number of vehicles in a single time window element determined by traffic volume density in a time window [0, t], and has a strong positive correlation with the number of vehicles driving off from the station, $\beta_t$ is the number of vehicles driving off from the station in the absence of oscillation, and is the average number of vehicles driving into the expressway in the time window [0, t]; f(x) is obtained by fitting the wave function based on series $N_t$, and then mapping coefficients $\alpha$ and $\beta$ of the probability density to the total traffic volume are estimated by the least square method.

Beneficial effects: Compared with the prior art, the present invention effectively integrates the advantages of statistical physics and dynamic equation modeling according to an idea of overall traffic flow modeling from an uncertainty view, has such advantages as simple model, definite parameter meaning, and easy solution and calculation, is of reference significance for modeling of traffic flow in which multiple strategies and states exist for individuals and are difficult to observe, and presents new idea for traffic flow modeling.

BRIEF DESCRIPTION OF THE DRAWINGS

FIG. 1 is a flowchart of the present invention;

DETAILED DESCRIPTION

The present invention will be further described in detail below with reference to the drawings.

Figure 2:
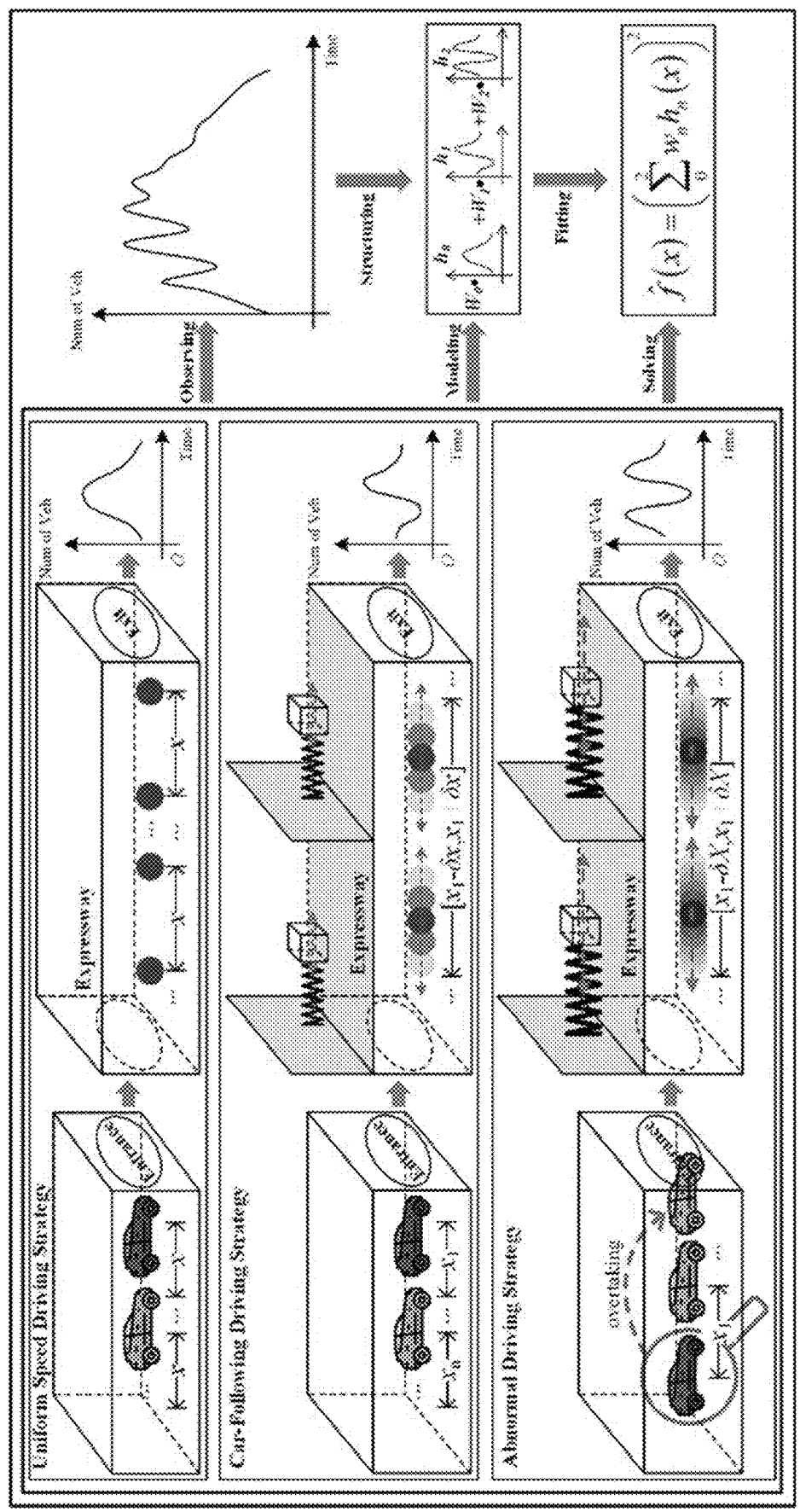
FIG. 2 is a schematic diagram of modeling of the long-distance expressway traffic flow based on a quantum harmonic oscillator model.

The present invention provides a method for simulating stochastic oscillations in an individual-granularity long-distance expressway traffic flow using quantum harmonic oscillator, wherein each individual vehicle in the long-distance expressway traffic flow is abstracted as a quantized particle, a driving strategy selected by the individual vehicle is regarded as an independent energy state, and the transition of the driving strategy is regarded as approximately the transition of an energy level, and overall modeling of state of the vehicles is carried out under a nondeterminacy framework while referring to a superposition state and a wave function in quantum mechanics, thereby constructing a long-distance expressway traffic flow model based on a quantum harmonic oscillator (QHO) model, as shown in FIG. 2. The mapping conversion relation between the movement of the individual vehicles and the traffic volume time series for vehicles driving off from the expressway is constructed through the mathematical expression of the QHO model, and the model can be solved by fitting the wave functions under different driving strategies with the traffic volume time series observed at a real exit.

In the expressway traffic flow, three driving strategies of constant-speed driving, vehicle-following driving and abnormal driving can be selected by an individual. In the constant-speed driving strategy, vehicles, distributed in a certain pattern, drive into the expressway and always drive at a constant speed without interaction throughout the traffic flow, and the traffic volume time series for vehicles finally driving off/into the expressway are the same or similar. Therefore, the constant-speed driving strategy can be abstracted as the energy ground state of the quantum harmonic oscillator. Under the influence of the autonomous decision of the individual and the interaction between the vehicles, the driving strategy selected by the driver is changed from the stable constant-speed driving to the vehicle-following driving or abnormal driving, that is, the energy level transitions from an ideal ground state to an excited state. In the process of quantization description, the definite position and the driving state of each vehicle cannot be accurately determined, the position is represented by the presence of the probability distribution described by a wave function near a specific position, and the driving strategy is represented by the superposition structure of the corresponding wave functions in three different energy level states. As shown in FIG. 1, the method comprises the following steps.

Step 1: describing the speed and position of a vehicle by a quantum superposition state, modeling an expressway traffic flow as a quantum harmonic oscillator model, and constructing an energy eigenequation of the quantum harmonic oscillator to describe movement of the vehicle.

In an ideal traffic flow, all vehicles run at a constant speed, so that the position of any vehicle at any time point is definite, and the speed and position are referred to as an ideal speed and an ideal position, respectively. In a real expressway traffic flow, under the influence of the autonomous decision of a driver and the interaction between the vehicles, the driver will control the speed of a vehicle according to real conditions, so that real speed is greater than or less than the ideal speed, and a real position oscillates near the ideal position, that is, the assumption of the ideal traffic flow fails. In addition, due to the "black box" characteristic of the expressway traffic flow, the speed and position of the vehicle at any time point can only be represented by a superposition state, which forms a sample of the movement of the vehicle. Therefore, the quantum harmonic oscillator describing the complete movement of the vehicle can be constructed by superposing all samples of the discrete movements one by one and represented by an energy eigenequation.

In an ideal long-distance traffic flow, all vehicles run at a constant speed of v, so that the ideal position of any vehicle k at a time point t is definite, and recorded as $S_{kt}$. In a real long-distance traffic flow, a driver will make an autonomous decision to accelerate or decelerate according to the driving environment, personal decision and other factors, so that the real speed of the vehicle is greater than or smaller than the ideal speed v, and recorded as $|\uparrow\rangle$ and $|\downarrow\rangle$, and then the real position of the vehicle is ahead of or behind the ideal position $S_{kt}$, and recorded as $|\rightarrow\rangle$ and $|\leftarrow\rangle$. Since the long-distance traffic flow is a "black box" system, in which the states such as the speed and position of the vehicle at any time cannot be accurately observed, the speed and position of the vehicle are represented by a superposition state, that is, the speed of the vehicle can be represented by the superposition state $V_t = a_t |\uparrow\rangle + b_t |\downarrow\rangle$ i and the position can be represented by the superposition state $S_t = c_t |\rightarrow\rangle + d_t |\leftarrow\rangle$ i at the time point t, wherein i is an imaginary unit, $a_t$ and $b_t$ represent the probability amplitudes of acceleration and deceleration, respectively, $c_t$ and $d_t$ represent the probability amplitudes of the position of the vehicle being ahead of or behind the ideal position, respectively, and $|a_t|^2 + |b_t|^2 = |c_t|^2 + |d_t|^2 = 1$. Thus, the movement of the vehicle can be described as a quantum harmonic oscillator with the energy eigenequation as follows:

$$iA\frac{d}{dt}\psi(x) = H\psi(x) \tag{1}$$

wherein i is an imaginary unit; A is a constant describing the distribution of individual energy levels; $\psi(x)$ is a wave function representing the probability amplitude of an individual appearing at a specific position; $H = f(V_t) + g(S_t)$ is Hamiltonian of the system and a core characteristic of dynamic evolution of the system; $f(V_t)$ and $g(S_t)$ are kinetic energy and potential energy of the harmonic oscillator, respectively.

Step 2: constructing an n-order Hermite polynomial based on the energy eigenequation, constructing a quantum harmonic oscillator model for simulating the stochastic oscillation in the long-distance traffic flow with multiple driving strategies, and optimizing a solution model.

The energy eigenequation of the quantum harmonic oscillator is essentially a second-order homogeneous linear differential equation whose general solution can be converted into an Hermite equation, which can represent the relation between different energy levels and the probability amplitudes of vehicles appearing at a specific station in the expressway traffic flow. The fitting parameter $w_n$ of the wave function can be solved by constrained nonlinear optimization. However, the constraint is $\Sigma_0^n w_n^2 = 1$, that is, the feasible solutions of $w_n$ are distributed on an N-dimensional sphere $S^N$, making it difficult to search along a monotonic gradient. In order to simplify the optimization solution, the present patent application solves the model parameter $w_n$ based on the idea of dimension transformation. On this basis, the probability of a vehicle appearing at a specific station is calculated to solve the wave function, thereby completing the construction and solution of the model.

In the real expressway traffic flow, the kinetic energy $f(V_t)$ and the potential energy $g(S_t)$ of the harmonic oscillator may be complex. However, equation (1) can be generally described as a second-order non-homogeneous linear differential equation of $$\frac{d\psi(x)^2}{dt^2} + P(x)\frac{d\psi(x)}{dt} + Q(x)\psi(x) = f(x),$$

with the general solution as follows:

$$\psi_n(x) = \sum_0^n C_n(x) e^{\frac{-x^2}{2}} \quad (2)$$

Equation (2) can be converted to the Hermite equation as follows:

$$\psi_n(x) = \sum_0^n \frac{w_n}{(\sqrt{\pi} 2^n n!)^{\frac{1}{2}}} H_n(x) e^{\frac{-x^2}{2}} \quad (3)$$

wherein n is the number of energy levels representing the number of driving strategies which can be selected by the driver in the driving process, $H_n(x)$ is an n-order Hermite polynomial, and $w_n$ is a fitting parameter of the wave function representing the probability amplitude of the harmonic oscillator being at different energy levels. In quantum mechanics, the probability can be expressed as the square of the wave function, so that the probability of the vehicle appearing at a specific position in the long-distance traffic flow can be expressed as:

$$P = |\psi_n(x)|^2 = \left(\sum_0^n \frac{w_n}{(\sqrt{\pi} 2^n n!)^{\frac{1}{2}}} H_n(x) e^{\frac{-x^2}{2}}\right)^2 \quad (4)$$

Equation (4) is the QHO model of the long-distance traffic flow. Based on equation (4), $w_n$ can be solved by function approximation as long as the probability P of the vehicle appearing at the spatial position can be obtained by observation. Considering that $$\frac{e^{\frac{-x^2}{2}}}{\sqrt{2\pi}}$$

is a probability density function of the standard normal distribution function, $$h_n(x) = H_n(x) \frac{e^{\frac{-x^2}{2}}}{(\sqrt{\pi} 2^n n!)^{\frac{1}{2}}}$$

can be converted to a probability expression of the Hermite polynomial, wherein $h_n(x)$ reflects the oscillation structures of different modes. Due to the obvious statistical characteristics of $h_n(x)$, the probability density function of the traffic volume time series can be fitted using Hermite polynomials with different orders according to equation (4), so that the distribution characteristics of different distribution structures in the traffic volume time series can be obtained through decomposition.

f(x) is set as the probability density function of the vehicle distribution, then the n-order Hermite polynomial approximation conversion is an optimization problem as follows:

$$\begin{cases} \text{Objective function: } \hat{f}(x) = \left(\sum_0^n w_n h_n(x)\right)^2 \\ \text{Constraint:} \sum_0^n w_n^2 = 1 \end{cases} \quad (5)$$

Figure 3:
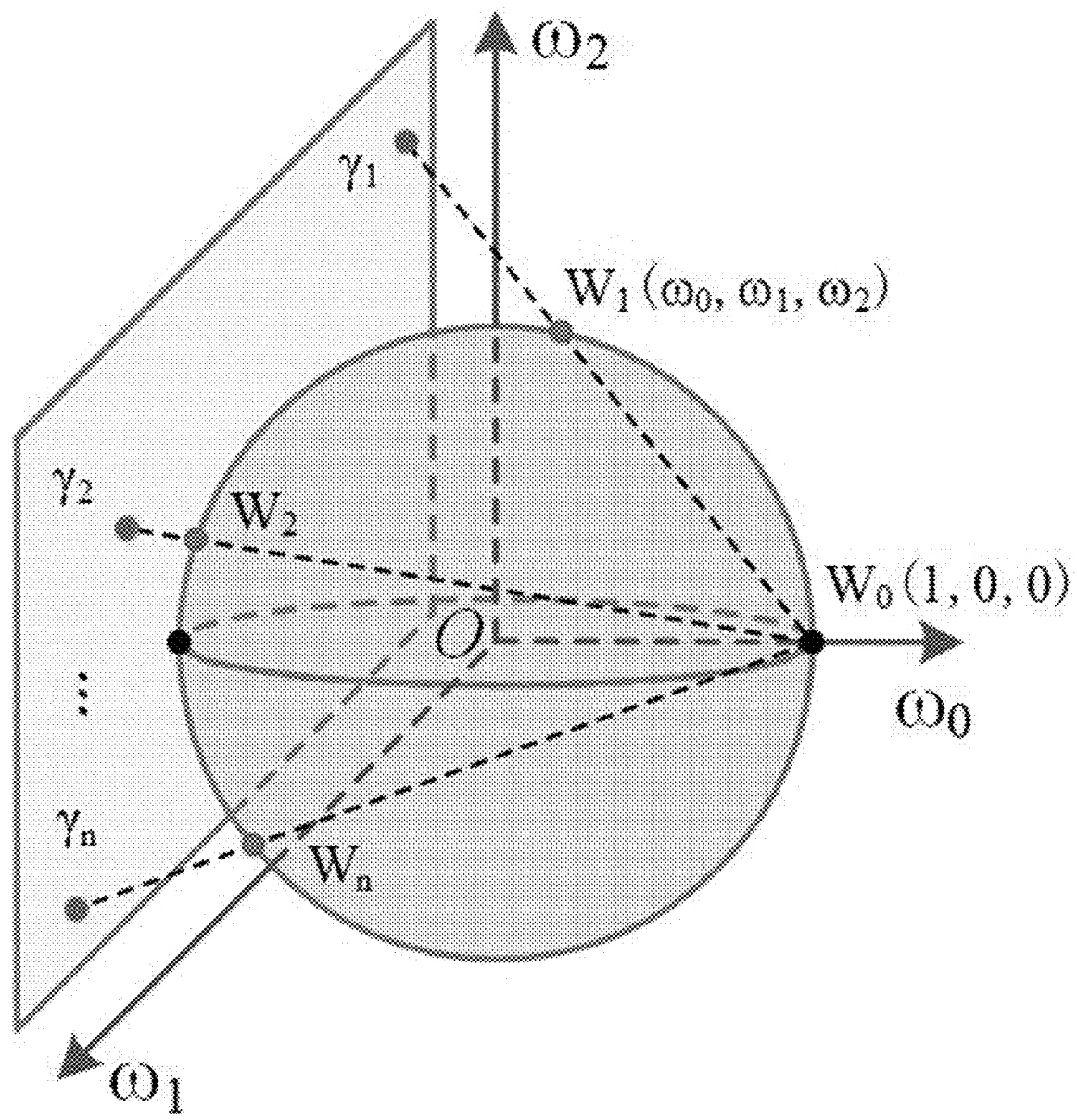
FIG. 3 is a schematic diagram of a dimensional transformation for the optimization solution of $w_n$.

Equation (5) can be solved by constrained nonlinear optimization. However, the constraint is $\Sigma_0^n w_n^2 = 1$, that is, the feasible solutions of $w_n$ are distributed on the unit an N-dimensional sphere $S^N$, making it difficult to search along a monotonic gradient. To simplify the optimization solution, points on an N-dimensional sphere $S^N$ can be projected onto a plane $R^{N+1}$ by inverse stereographic projection, so that an unconstrained optimization solution can be performed on the plane, as shown in FIG. 3. To this end, with $W_0(1,0,0)$ as the origin, the feasible solutions on an N-dimensional sphere $S^N$ are projected onto the plane x=−1, that is, $W_1$ is projected as $\gamma_1$, and $W_n$ is projected as $\gamma_n$, so that the dimension-reducing transformation of the feasible region is realized, and the optimization solution of $W_n$ on an N-dimensional sphere $S^N$ is converted to the optimization solution of In on the two-dimensional plane. After the optimal solution of In is obtained, the dimension-increasing transformation is performed to realize the optimization solution of $W_n$. Thus, the configuration of the optimal driving state approximating the traffic flow oscillation structure is obtained, with a specific algebraic expression of $$\begin{cases} [P^{-1}(\gamma)]_n = \begin{cases} \dfrac{S^2-1}{S^2+1}, & \text{if } n=0 \\ \dfrac{2\gamma_n}{S^2+1}, & \text{if } n \geq 1 \end{cases} \\ S^2 = \sum_0^n \gamma_n^2 \end{cases} \quad (6)$$

expressed as follows:

$$[P(\omega)]_n = \frac{\omega_n}{(1-\omega_0)}$$

On this basis, a maximum likelihood estimation is constructed as follows:

$$\begin{cases} \text{Objective function: } \hat{f}(x) = \left(\sum_{k=0}^n w_k h_k(x)\right)^2 \\ \text{Likelyhood function: } \ell(w) = \sum_{i=1}^K \log\left(\sum_{k=0}^n [P(w)]_k h_k(x_i)\right)^2 \end{cases} \quad (7)$$

The L-BFGS is the most common method for solving the unconstrained nonlinear programming problem and has advantages such as high convergence rate and low memory overhead. In equation (7), the likelihood function $\ell(w)$ has monotonicity, and can be solved through a fast search by a common optimization method such as L-BFGS.

Step 3: constructing a mapping mechanism between the probability and the traffic volume to simulate the traffic volume.

In order to simulate the traffic volume, another key step lies in exploring the mapping conversion relation between the probability obtained by solving the wave function and the traffic volume. To this end, the present patent application, based on the calculus, explores the relation between the probability and the traffic volume time series for vehicles driving off from the expressway, and constructs a conversion mapping mechanism between the two, thus simulating the traffic volume.

The normalization of the wave function in the QHO model is another issue that needs to be paid attention to. In a real long-distance traffic flow, the states of the vehicle at any time point cannot be accurately observed, and only the traffic volume time series $N_t$ of vehicles driving off from the expressway can be observed. A given time window [0,t] can be regarded as a time window element for the traffic flow. The wave function needs to meet the normalization condition $f|\psi(x)|^2=1$, that is, the total probability of the vehicle appearing in the time window element for the traffic flow cannot exceed 1. However, it is difficult to select a real modeled time window that enables the total number of vehicles to be exactly 1, so that a linear mapping function needs to be constructed:

$$\begin{aligned} N_t &= \int_0^t (\alpha_t P_t + \beta_t) \\ &= \alpha f(x) + \beta \end{aligned} \quad (8)$$

wherein $\alpha$ and $\beta$ are normalized coefficients, $\alpha_t$ is the number of vehicles in a single time window element determined by the traffic volume density in the time window [0, t], and has a strong positive correlation with the number of vehicles driving off from the station. $\beta_t$ is the number of vehicles driving off from the station in the absence of oscillation, and can be regarded as the average number of vehicles driving into the expressway in the time window [0,t]. Since there is a linear correlation between $N_t$ and $f(x)$, $f(x)$ can be obtained by fitting the wave function based on series $N_t$, and then mapping coefficients $\alpha$ and $\beta$ of the probability density to the total traffic volume are estimated by the least square method.

Figure 4:
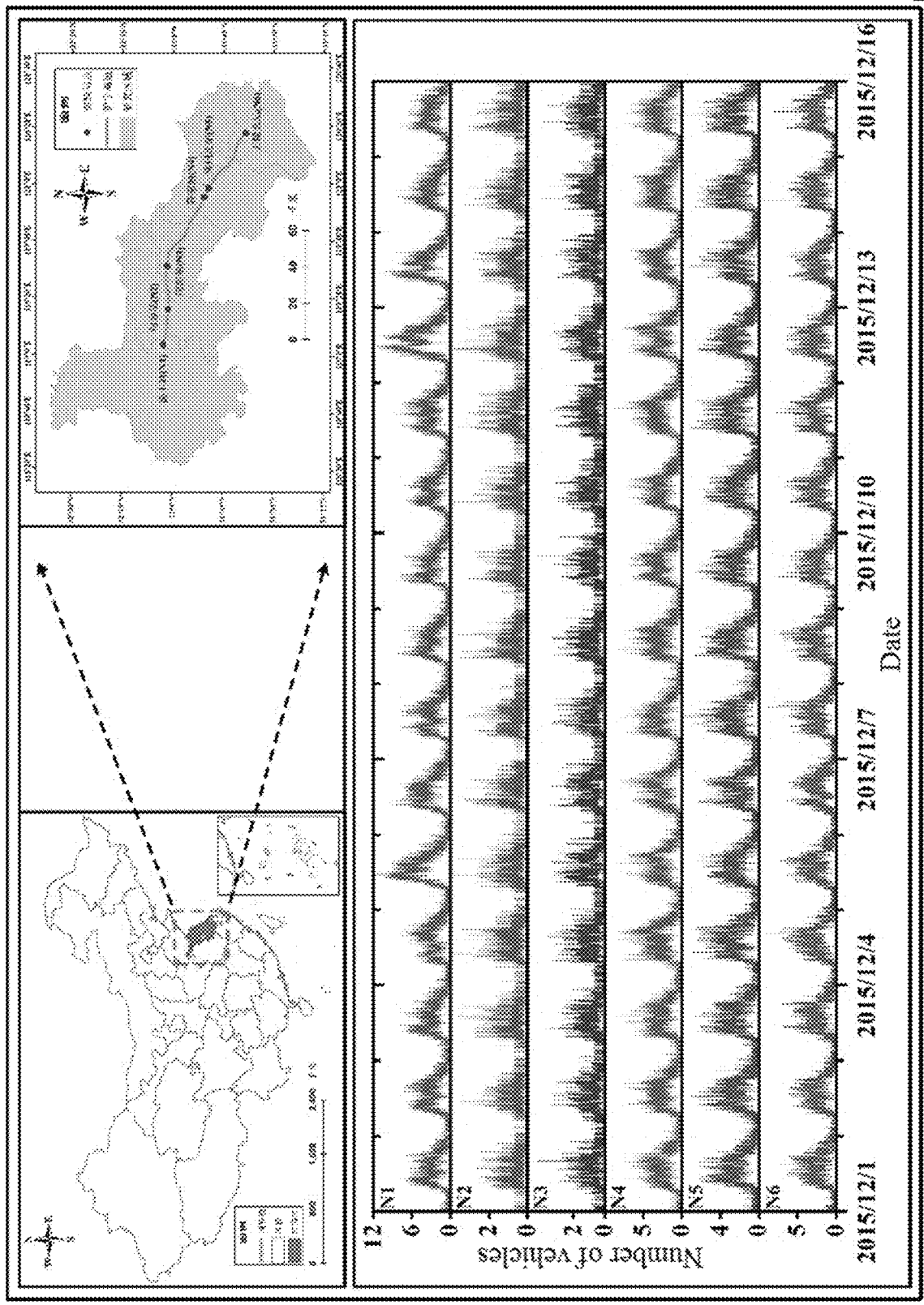
FIG. 4 is a diagram showing the distribution of stations in the study area and experimental traffic volume time series.

In the present invention, traffic volume time series data of vehicles driving off from the Shanghai-Nanjing expressway via the six typical toll stations on the Nanjing-Wuxi section (Tangshan station (N1), Jurong station (N2), Heyang station (N3), Xuejia station (N4), Changzhoubei station (N5) and Wuxibei station (N6)) from Dec. 1 to 15, 2015 are collected as experimental data, with the data collection time granularity being 1 minutes, as shown in FIG. 4.

According to the three driving strategies, a 2-order Hermite polynomial is selected for the fitting, and L-BFGS is selected for the optimization. An autoregressive integrated moving average model (ARIMA) and a long short term memory (LSTM) are selected as reference models. The order of ARIMA is determined by the AIC criterion, and the ARIMA(5,0,0) model is obtained for all of the six stations. For the LSTM model, it is determined via parameter adjustment that the optimal network structure is four neurons in a hidden layer and one neuron in an output layer. The input variables are 1440 time steps, i.e., 1 day expressway traffic volume time series. And the loss function is a mean square error (MSE) loss function, the optimization algorithm is Adam, the activation function is tanh, and the training period of the model is 100, with one prediction result being output each time. In order to evaluate the modeling effect, a mean absolute error (MAE), a root mean square error (RMSE) and a coefficient of determination ($R^2$) are selected as indexes for the lateral comparison of different models. The specific formula definitions are shown in Table 1. In those formulas, $y_i$ is the actually observed traffic volume of expressway traffic flow, $\bar{y}_i$ is the average traffic volume of expressway traffic flow, $\hat{y}_i$ is the simulated traffic volume, and m is the number of fitting samples.

TABLE 1

Definitions of evaluation indexes for modeling effect

| Evaluation index | Formula definition |
|---|---|
| Mean absolute error (MAE) | $MAE = \dfrac{1}{m}\sum_{i=1}^m \|y_i - \hat{y}_i\|$ |
| Root mean square error (RMSE) | $RMSE = \sqrt{\dfrac{1}{m}\sum_{i=1}^m \|y_i - \hat{y}_i\|}$ |
| Coefficient of determination ($R^2$) | $R^2 = 1 - \dfrac{1}{m}\sum_{i=1}^m \|y_i - \hat{y}_i\| \Big/ \sqrt{\dfrac{1}{m}\sum_{i=1}^m \|y_i - \hat{y}_i\|}$ $R^2 = 1 - \sum_{i=1}^m \|y_i - \bar{y}_i\|^2 \Big/ \sum_{i=1}^m \|y_i - \bar{y}_i\|^2$ |

The traffic volume time series in an 1-minute time window with the highest fineness are selected as experimental data, and fitted to obtain QHO model parameters of the six stations, as shown in Table 2. $w_0$, $w_1$ and $w_2$ are fitting coefficients of 0-, 1- and 2-order Hermite polynomials, respectively, which reflect the probability amplitudes of the wave function distribution modes of a ground state, a first excited state and a second excited state, respectively, and α and β are mapping coefficients of the probability to the traffic volume.

TABLE 2

QHO model parameters for expressway traffic flow at minute scale

| Model parameter | N1 | N2 | N3 | N4 | N5 | N6 |
|---|---|---|---|---|---|---|
| $w_0$ | 0.9659 | 0.9691 | 0.9665 | 0.9621 | 0.9629 | 0.9637 |
| $w_1$ | −0.0801 | −0.1258 | −0.1043 | −0.0752 | −0.0844 | −0.0825 |
| $w_2$ | 0.2463 | 0.2123 | 0.2344 | 0.2620 | 0.2564 | 0.2540 |
| α | 18.5478 | 5.2914 | 6.8855 | 16.4818 | 14.8361 | 14.9717 |
| β | −10.9356 | −3.0724 | −4.1256 | −9.8792 | −8.9063 | −8.9768 |

$w_0$ is between 0.96 and 0.97 for all of the six stations, and is slightly greater for the stations N2 and N3, and the parameter $w_1$ for the stations N2 and N3 are significantly different from those of the other four stations. The stations N2 and N3 are located in the county-level cities of Jurong and Danyang, respectively, and the traffic volume there is smaller than that of the other four stations. The smaller the traffic volume, the less interaction between the vehicles in the unit volume element, and the vehicle tends to drive in a constant-speed driving strategy or a vehicle-following strategy. Therefore, the parameter $w_0$ and the absolute value of the parameter $w_1$ for the stations N2 and N3 are greater than those for the other four stations, and the model parameters show that the traffic strategy at the exits and the fluctuation mode of the two stations are significantly different from those of the other four stations located in the prefecture-level cities. The spatial difference between stations is more obvious for $w_2$ than for $w_0$, and $w_1$, probably indicating regional differences in abnormal driving dominated by overtaking. As can be seen from the absolute values of the three energy level coefficients, the coefficient of the ground state are much greater than that of the first excited state and the second excited state, indicating that the Shanghai-Nanjing expressway is generally smooth and orderly driving dominates the traffic flow during the study period. However, the absolute value of the coefficient of the second excited state is greater than that of the first excited state, indicating that the probability of the irregular high-frequency stochastic oscillation occurring in the Shanghai-Nanjing expressway traffic flow is higher than that of the vehicle-following stochastic oscillation. Considering that the Shanghai-Nanjing expressway is a typical traffic flow featuring a large volume of mixed passenger and freight transport, the difference in the speed limits for passenger and freight vehicles may be one of the reasons for such high-frequency irregular stochastic oscillations. For the coefficients α and β, the coefficients α and β for the N2 and N3 stations are significantly smaller than those for the other four stations, indicating a similar rule as the fluctuation mode probability amplitude.

Figure 5:
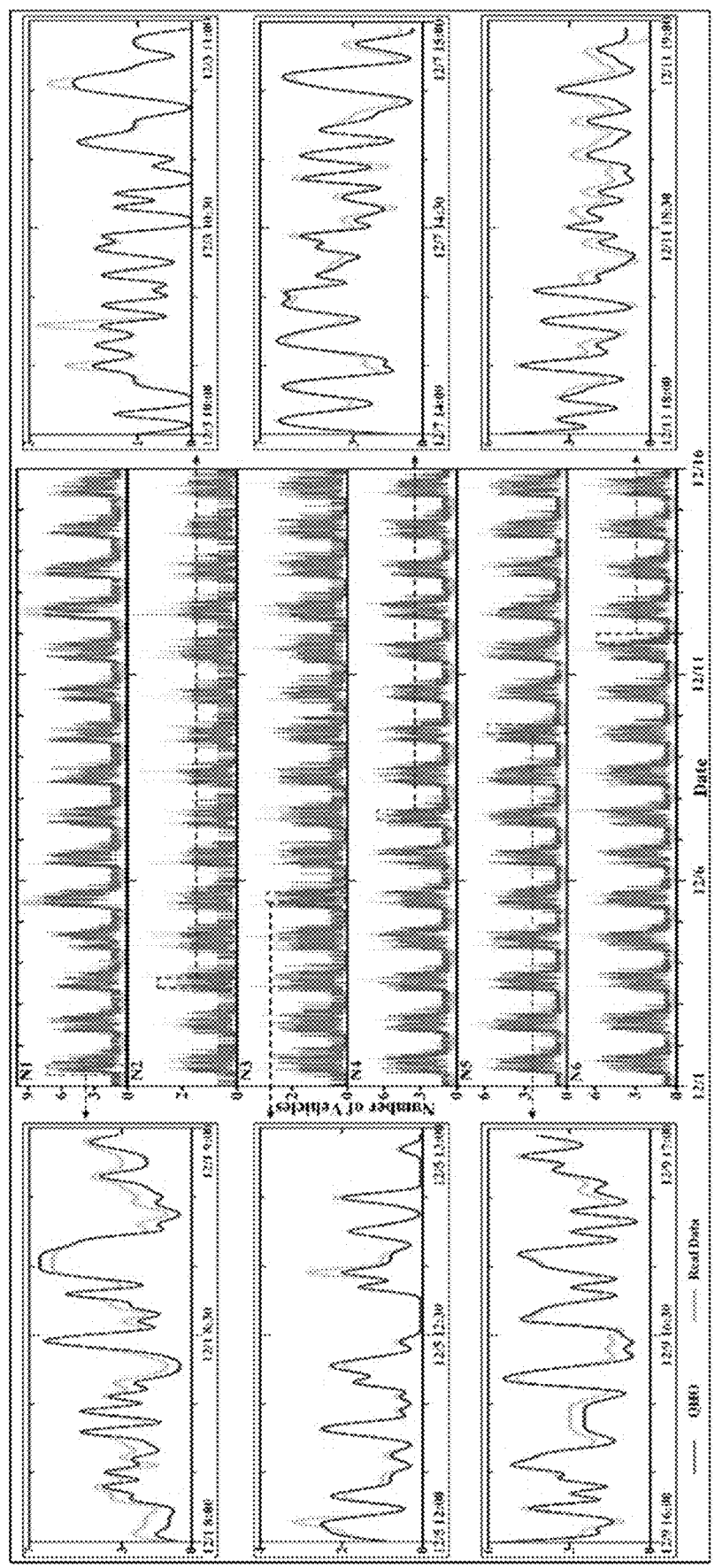
FIG. 5 is a diagram showing the comparison of the simulated QHO model-values with the observed values.

The comparison of the simulated QHO model values with the observed traffic volume for the six stations selected for the study is shown in FIG. 5. The simulated traffic volume are well matched with the observed traffic volume, which can not only simulate the overall trend of the long-distance traffic flow, but also accurately reveal irregular fluctuation structures and different frequency components. The QHO model fits well at 21,600 time points over 15 days, indicating the stability of fitting over a long period of time. The results of local scaling show that the fit is good for the other four stations except for N1 and N6 where there is an error of about 1 vehicle in the highly fluctuating part of the traffic flow, indicating the strong ability of the QHO model to capture the complex fluctuations in the fine scale of the traffic volume and the peaks and valleys.

Figure 6A:
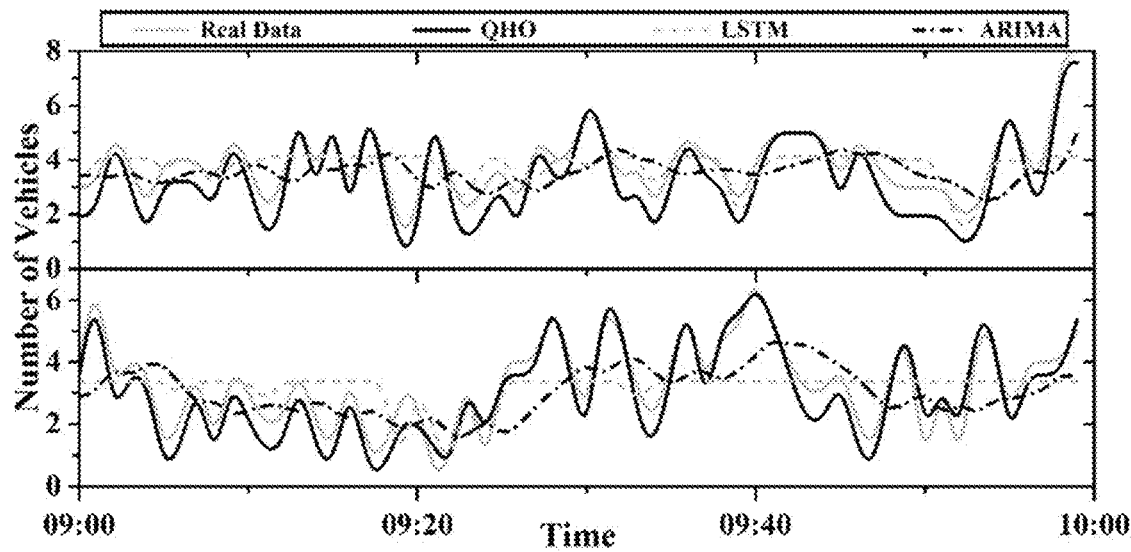
FIG. 6A and FIG. 6B are diagrams showing the comparison of modeling effects of different models.

The traffic total for the six stations on Dec. 7, 2015 is the median of the daily traffic total for the 15-day period, and the date is representative of the overall trend during the study period. For the stations N1 and N4, the modeling accuracy of the comparative model is closer to that of the QHO model, so the time period from 9:00 to 10:00 on Dec. 7, 2015 is selected for the comparison of fitted series with the observed traffic volume, as shown in FIG. 6A. In general, the QHO model has the best simulation, followed by the LSTM model and the ARIMA model successively. The QHO model has strong ability to capture the changing trend of the traffic volume, can capture almost all high-frequency stochastic oscillations, and has reduced ability to simulate the low-frequency stochastic oscillation, with the simulation errors all within 1 vehicle. This is due to the integration of the number of vehicles driving off from the station in the absence of oscillation within the time window element, which leads to weakening of the heterogeneity of the time window and integration into the parameter β. For four high-frequency oscillations of the traffic volume at the N1 station (9:10-9:22, 9:27-9:33, 9:40-9:45 and 9:54-10:00) and two high-frequency oscillations of the traffic volume at the N4 station (9:25-9:42, 9:47-9:55), the QHO model fits very well, while the ARIMA model has poor ability to capture the high-frequency oscillations and can only simulate the general changing trend of the traffic volume. For the joint of the high-frequency oscillation and the low-frequency oscillation, such as around 9:22 at the N1 station and around 9:26 at the N4 station, the LSTM model fits poor, which may be caused by the parameter adjustment of the model due to the large parameter change at the joint of the high-frequency oscillation and the low-frequency oscillation.

Figure 6B:
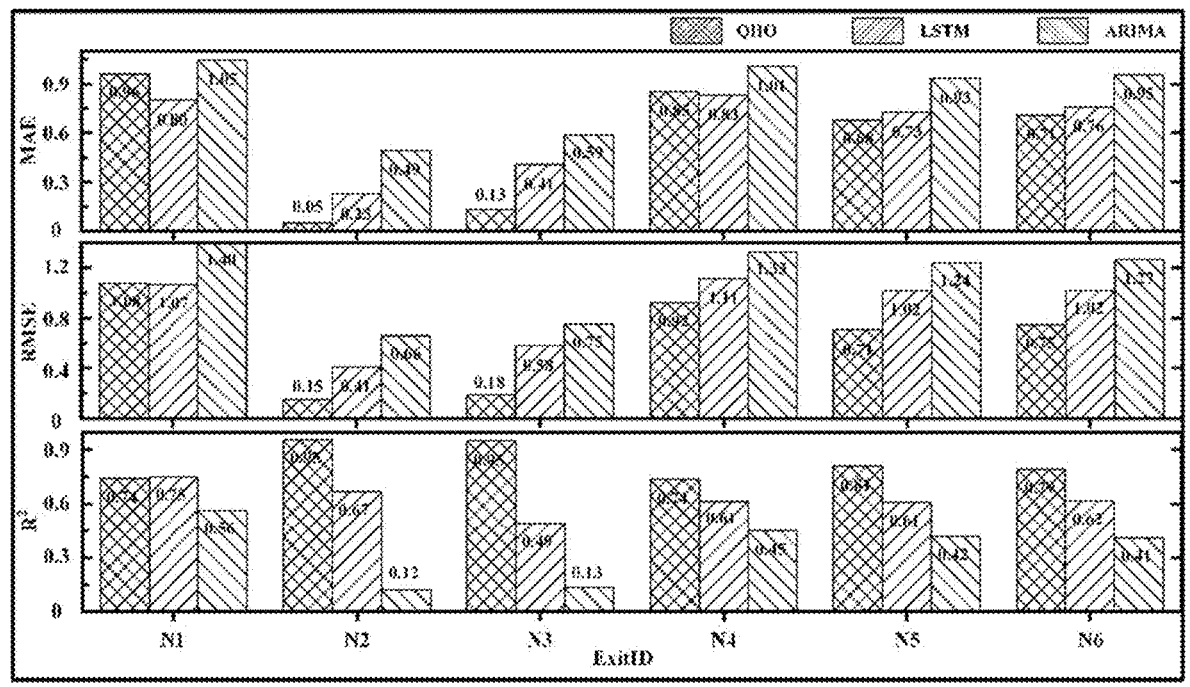

From the comparison of the modeling effect indexes of the QHO model and the LSTM and ARIMA models, as shown in FIG. 6B, among the six stations, except that the $R^2$ of the N1 station is slightly lower than that of the LSTM model, the $R^2$ of the other five stations is significantly greater than that of the comparison models, with the corresponding MAE and RMSE equal to or lower than those of the comparative models. The modeling accuracy of the N2 and N3 stations is highest, with the $R^2$ reaching 95%, which may be associated with less overall traffic $a_t$ the N2 and N3 stations. The unit volume element with small traffic volume can better represent the driving rule of an individual vehicle, so that the modeling condition of QHO is better met. For the other four stations with larger traffic volume, the individual difference of the vehicles in the unit volume element will lead to the decoherence phenomenon of the movement of the vehicles, resulting in a poor fitting effect. In general, compared with the ARIMA model, MAE of the QHO model is reduced by 32.63% on average, RMSE is reduced by 42.99% on average, and modeling accuracy ($R^2$) is improved by 58.05% on average, indicating the high accuracy and stability of the QHO model for simulating the individual-granularity long-distance traffic flow.

In this embodiment, the average calculation time of the QHO, ARIMA, and LSTM models for each station is 1.15 s, 6.66 s, and 4142.75 s, respectively. The QHO model has only 5 parameters, so the calculation cost of the QHO model is small and the calculation time is the shortest. Moreover, the parameters of the QHO model have definite meanings and can reveal the structure and characteristic of stochastic oscillation in the traffic flow, and thus this model has obvious advantages. The number of parameters of the ARIMA model is also small (6 parameters), so both the calculation cost and the calculation time are within an acceptable range. In terms of time series, these parameters reflect the relation between historical data and simulated data in the time series, which is not intuitive for the modeling and simulation of stochastic oscillation in the traffic flow, let alone reveals the essential characteristics of stochastic oscillation in the traffic flow. The LSTM model is more complex. It is a "black box" model that uses more parameters to model the series and thus has problems such as overfitting and computational complexity.

As can be seen from the simulation of minute-scale stochastic oscillation in the traffic flow at six stations on the Shanghai-Nanjing expressway for a total of 15 days, the QHO model for simulating the stochastic oscillation in the individual-granularity long-distance expressway traffic flow can well reproduce the stochastic oscillation of each frequency component of the traffic flow at the individual granularity level, and its average modeling accuracy ($R^2$) is improved by 24.80% and 58.05% compared with LSTM and ARIMA, respectively. The QHO model parameters for simulating the stochastic oscillation in the individual-granularity long-distance expressway traffic flow have definite physical meanings, which can not only reflect the flow difference of different stations, but also reveal the scale effect of the stochastic oscillation in the traffic flow at different time windows. The in-depth study on the QHO model for simulating the stochastic oscillation in the individual-granularity long-distance expressway traffic flow can provide new theories and methods for the simulation of stochastic oscillation in the traffic flow from an uncertainty view.

What is claimed is:

1. A method for simulating stochastic oscillation in an individual-granularity long-distance expressway traffic flow using a quantum harmonic oscillator, comprising the following steps: (1) describing speed and position of a vehicle by a quantum superposition state, and constructing an energy eigenequation of the quantum harmonic oscillator to represent movement of the vehicle; (2) constructing an n-order Hermite polynomial based on the energy eigenequation, constructing a quantum harmonic oscillator model for simulating a stochastic oscillation in a long-distance traffic flow with multiple driving strategies, and optimizing a solution model; and (3) constructing a mapping mechanism between a probability and a traffic volume to simulate the traffic volume, wherein each individual vehicle in the long-distance expressway traffic flow is abstracted as a quantized particle, a driving strategy selected by the individual vehicle is regarded as an independent energy state, and the transition of the driving strategy is regarded as approximately the transition of an energy level, wherein the step (3) is implemented as follows:

$$N_t = \int_0^\tau (\alpha_t P_t + \beta_t) = \alpha f(x) + \beta \qquad (8)$$

wherein Nt is the traffic volume of vehicles driving off from the expressway, a and Rare normalized coefficients, at ~ is a number of vehicles in a single time window element determined by traffic volume density in a time window [0, t], and has a strong positive correlation with the number of vehicles driving off from the station, f3t is a number of vehicles driving off from the station in the absence of oscillation, and is the average number of vehicles driving into the expressway in the time window [0, t]; f(x) is obtained by fitting the wave function based on series Nt, and then mapping coefficients a and f3 of the probability density to the total traffic volume are estimated by the least square method.

2. The method according to claim 1, wherein the step (1) is implemented as follows:
all vehicles run at a constant speed of v, and an ideal position of any vehicle k at a time point t is $S_{kt}$; when real speed of the vehicle is greater than or less than the ideal speed v, and recorded as |↑⟩ and |↓⟩, a real position of the vehicle is ahead of or behind an ideal position $S_{kt}$, and recorded as |→⟩ and |←⟩; the speed of the vehicle is represented by the superposition state $V_t = a_t|↑⟩ + b_t|↓⟩i$ and the position is represented by the superposition state $S_t = C_t|→⟩ + d_t|←⟩i$ at the time point t, wherein i is an imaginary unit, $a_t$ and $b_t$ represent probability amplitudes of acceleration and deceleration, respectively, $c_t$ and $d_t$ represent probability amplitudes of the position of the vehicle being ahead of or behind the ideal position, respectively, and $|a_t|^2 + |b_t|^2 = |c_t|^2 + |d_t|^2 = 1$; the movement of the vehicle is described as a quantum harmonic oscillator with an energy eigenequation as follows:

$$iA\frac{d}{dt}\psi(x) = H\psi(x) \qquad (1)$$

wherein i is an imaginary unit; A is a constant describing the distribution of individual energy levels; ψ(x) is a wave function representing the probability amplitude of an individual appearing at a specific position; $H = f(V_t) + g(S_t)$ is Hamiltonian of the system and a core characteristic of dynamic evolution of the system; $f(V_t)$ and $g(S_t)$ are kinetic energy and potential energy of the harmonic oscillator, respectively.

3. The method according to claim 1, wherein the step (2) is implemented as follows:
in a real expressway traffic flow, a following n-order Hermite polynomial is constructed based on the energy eigenequation:

$$\psi_n(x) = \sum_0^n \frac{w_n}{(\sqrt{\pi} 2^n n!)^{\frac{1}{2}}} H_n(x) e^{\frac{-x^2}{2}} \qquad (3)$$

wherein n is a number of energy levels representing a number of different driving strategies which can be selected by a driver in the driving process, $H_n(x)$ is an n-order Hermite polynomial, $W_n$ is a fitting parameter of the wave function representing the probability amplitude of the harmonic oscillator at different energy levels; in quantum mechanics, the probability can be expressed as square of wave function, so that the probability of the vehicle appearing at a specific position in the long-distance traffic flow can be expressed as:

$$P = |\psi_n(x)|^2 = \left(\sum_0^n \frac{w_n}{\left(\sqrt{\pi}2^n n!\right)^{\frac{1}{2}}} H_n(x) e^{\frac{-x^2}{2}}\right)^2 \quad (4)$$

equation (4) is a quantum harmonic oscillator model of the long-distance traffic flow $$h_n(x) = H_n(x) \frac{e^{\frac{-x^2}{2}}}{\left(\sqrt{\pi}2^n n!\right)^{\frac{1}{2}}}$$

is converted to a probability expression of the Hermite polynomial, wherein $h_n(x)$ reflects the oscillation structures of different modes; a probability density function of the traffic volume time series is fitted using Hermite polynomials with different orders according to equation (4), so that distribution characteristics of different distribution structures in the traffic volume time series are obtained through decomposition;

f(x) is set as the probability density function of the vehicle distribution, then the n-order Hermite polynomial approximation conversion is an optimization problem as follows:

$$\begin{cases} \text{Objective function: } \hat{f}(x) = \left(\sum_0^n w_n h_n(x)\right)^2 \\ \text{Constraint: } \sum_0^n w_n^2 = 1 \end{cases} \quad (5)$$

wherein equation (5) is solved by a constrained nonlinear optimization, and points on an N-dimensional sphere $\mathbb{S}^N$ are projected onto a plane $\mathbb{R}^{N+1}$ by inverse stereographic projection, so that an unconstrained optimization solution is performed on the plane, with a specific algebraic expression of $$[P(\omega)]_n = \frac{\omega_n}{(1-\omega_0)}$$

expressed as follows:

$$\begin{cases} [P^{-1}(\gamma)]_n = \begin{cases} \frac{S^2-1}{S^2+1}, & \text{if } n = 0 \\ \frac{2\gamma_n}{S^2+1}, & \text{if } n \geq 1 \end{cases} \\ S^2 = \sum_0^n \gamma_n^2 \end{cases} \quad (6)$$

maximum likelihood estimation is constructed as follows:

$$\begin{cases} \text{Objective function: } \hat{f}(x) = \left(\sum_{k=0}^n w_k h_k(x)\right)^2 \\ \text{Likelyhood function: } \ell(w) = \sum_{i=1}^K \log\left(\sum_{k=0}^n [P(w)]_k h_k(x_i)\right)^2 \end{cases} \quad (7)$$

* * * * *